US012787746B2

United States Patent
(12) United States Patent
Wang et al.

(10) Patent No.: US 12,787,746 B2
(45) Date of Patent: Nov. 3, 2026

(54) SEMICONDUCTOR DEVICE

(71) Applicant: SOCIONEXT INC., Kanagawa (JP)

(72) Inventors: Wenzhen Wang, Yokohama (JP); Atsushi Okamoto, Yokohama (JP); Hirotaka Takeno, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 444 days.

(21) Appl. No.: 18/432,890

(22) Filed: Feb. 5, 2024

(65) Prior Publication Data

US 2024/0274536 A1 Aug. 15, 2024

(30) Foreign Application Priority Data

Feb. 9, 2023 (JP) ................................ 2023-018427

(51) Int. Cl.
*H10W 20/41* (2026.01)
*H10D 84/85* (2025.01)

(52) U.S. Cl.
CPC ........ *H10W 20/427* (2026.01); *H10D 84/853* (2025.01); *H10D 84/856* (2025.01)

(58) Field of Classification Search
CPC .. H10W 20/427; H10D 84/834; H10D 84/853
See application file for complete search history.

(56) References Cited

U.S. PATENT DOCUMENTS 9,419,014 B2 8/2016 Gurumurthy
10,141,336 B2 11/2018 Lee
10,579,771 B2 3/2020 Do et al.
10,680,014 B2 * 6/2020 Ryu ...................... H10D 1/692
10,840,244 B2 * 11/2020 Maeda ............... H10D 30/6219
10,879,229 B2 12/2020 Sio et al.
11,469,239 B1 * 10/2022 Desai .................... G11C 11/414
11,741,285 B2 * 8/2023 Yang ..................... G06F 30/392 716/120
12,142,637 B2 * 11/2024 Lin ...................... H10D 62/127
12,564,041 B2 * 2/2026 Do ......................... H10D 30/43
12,598,978 B2 * 4/2026 Kim ................... H10D 84/0149
2021/0366895 A1 11/2021 Chang et al.
2022/0059572 A1 2/2022 Ryu et al.
2023/0420512 A1 * 12/2023 Yemenicioglu ........ H10D 30/43

* cited by examiner

*Primary Examiner* — Daniel Luke
(74) *Attorney, Agent, or Firm* — Rimon P.C.

(57) ABSTRACT

A semiconductor device includes: a substrate; a circuit region provided on the substrate; a first power supply line and a second power supply line, positioned in the circuit region; a first fin and a second fin, each extending in a first direction in the circuit region, in plan view, and protruding from the substrate; a first power supply switching circuit, positioned in the circuit region and including a first transistor formed with the first fin, the first circuit electrically connecting the first and second power supply lines, and the first fin extending in the first power supply switching circuit without cutting; and a second power supply switching circuit, positioned in the circuit region and including a second transistor formed with the second fin, the second circuit electrically connecting the first and second power supply lines, and including a fin-cut part in which the second fin is cut.

8 Claims, 14 Drawing Sheets

SEMICONDUCTOR DEVICE

CROSS-REFERENCE TO RELATED APPLICATIONS

This application is based on and claims priority to Japanese Patent Application No. 2023-018427, filed on Feb. 9, 2023, the entire contents of which are incorporated herein by reference.

BACKGROUND

1. Field of the Invention

The present invention relates to a semiconductor device.

2. Description of the Related Art

There is a technique whereby, in a semiconductor device, power supply switching circuits for controlling feeding of power supply voltages to standard cells are positioned in standard cell regions or the like where standard cells are to be provided. Also, well taps that feed voltages to the semiconductor device's substrate (to be more specific, well regions formed thereon) may be provided in power supply switching circuits. Furthermore, there are fin field effect transistors (FinFETs) formed with fins that protrude from a semiconductor substrate.

CITATION LIST

Patent Document

[Patent Document 1] US Patent Application Publication No. 2021/0366895
[Patent Document 2] U.S. Pat. No. 10,579,771
[Patent Document 3] U.S. Pat. No. 10,879,229
[Patent Document 4] U.S. Pat. No. 9,419,014
[Patent Document 5] U.S. Pat. No. 10,141,336
[Patent Document 6] US Patent Application Publication No. 2022/0059572

SUMMARY OF THE INVENTION

Technical Problem

When FinFETs included in a logic circuit or the like are formed with linear fins, the length of the fins is set to be less than or equal to the upper limit value for the length of fins, which is determined by the layout rules. Therefore, if a FinFET part, in which multiple FinFETs are positioned successively in one direction, is longer than the upper limit value, cut parts in which the fins are cut in the middle are created therein. However, if such cut parts are created in power supply switching circuits, the number of cut parts to be created in regions where standard cells are to be positioned can be reduced, so that the efficiency of positioning standard cells can be improved.

Meanwhile, in standard cell regions, in a region in which the width of a fin in the direction in which the fin extends is less than or equal to an upper limit value, it is preferable to position the fin without creating cut parts in the middle. However, if a power supply switching circuit including fin-cut parts is positioned in regions where no fin-cut parts are needed, the presence of these fin-cut parts might result in a decrease in the efficiency of positioning standard cells.

The present invention has been made in view of the above, and its object is therefore to reduce the decrease in the efficiency of positioning standard cells by appropriately positioning parts in which fins are cut in the middle, in standard cell regions.

Solution to Problem

According to one embodiment of the present invention, a semiconductor device includes:

a substrate;

a circuit region provided in the substrate;

a first power supply line and a second power supply line, positioned in the circuit region;

a first fin and a second fin, each fin extending in a first direction in the circuit region, in plan view, and protruding from the substrate;

a first power supply switching circuit, positioned in the circuit region and including a first transistor formed with the first fin,
 the first power supply switching circuit electrically connecting the first power supply line and the second power supply line, and
 the first fin extending in the first power supply switching circuit without cutting; and a second power supply switching circuit, positioned in the circuit region and including a second transistor formed with the second fin,
 the second power supply switching circuit electrically connecting the first power supply line and the second power supply line, and including a fin-cut part in which the second fin is cut.

Advantageous Effects of the Invention

According to the technique disclosed herein, parts in which fins are cut in the middle are appropriately positioned in standard cell regions, so that it is possible to reduce the decrease in the efficiency of positioning standard cells.

DETAILED DESCRIPTION OF THE PREFERRED EMBODIMENTS

Embodiments of the present invention will be described below with reference to the accompanying drawings. In the following description, codes/symbols that indicate signals will also be used as codes/symbols to indicate signal lines or signal terminals. Codes/symbols that indicate power supply voltages will also be used as codes/symbols to indicate power supply lines or power supply terminals to which power supply voltages are fed.

First Embodiment

Figure 1:
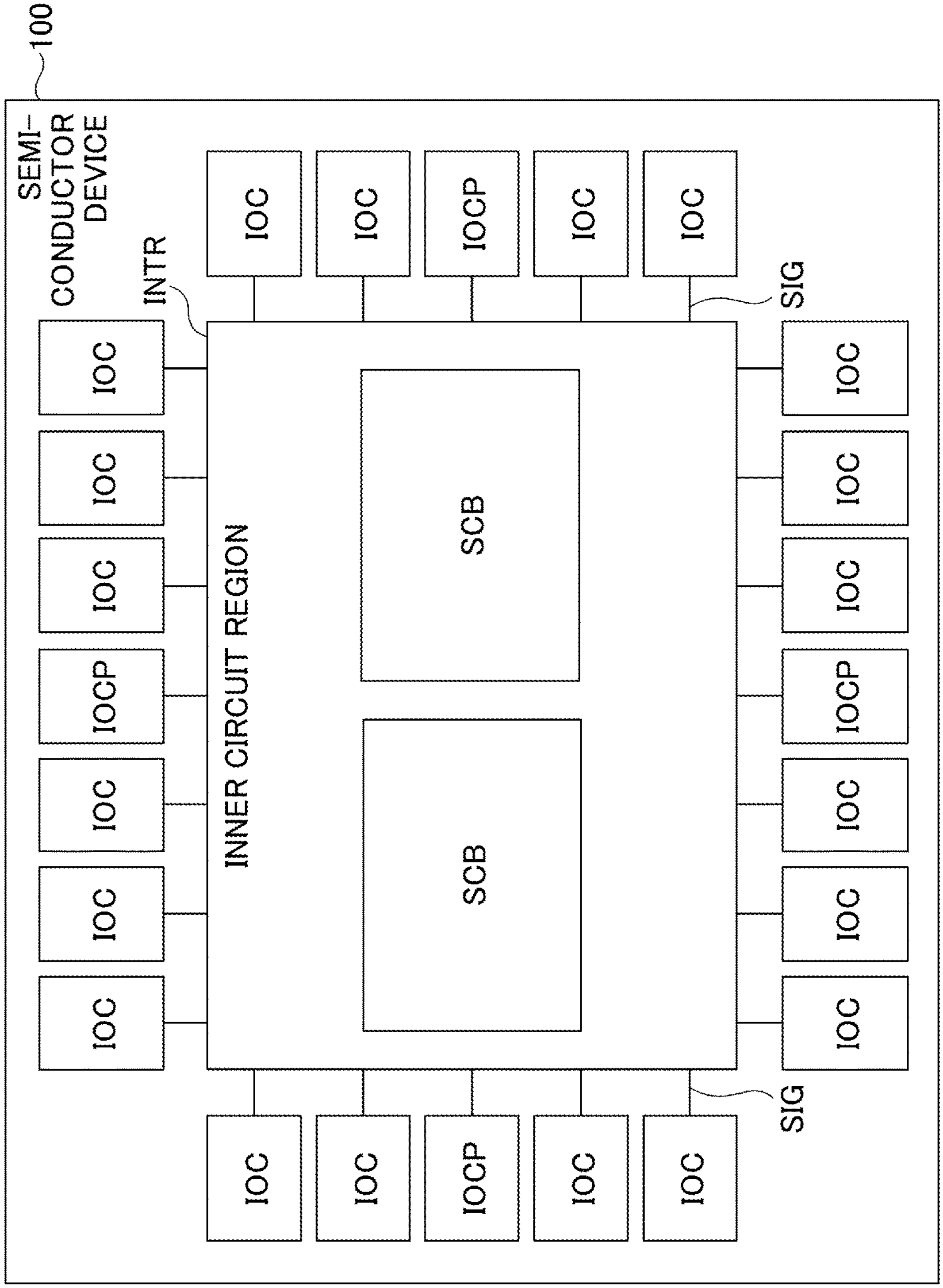
FIG. 1 is a diagram that illustrates an example layout of a semiconductor device according to a first embodiment.

FIG. 1 illustrates an example layout of a semiconductor device according to a first embodiment. For example, the semiconductor device 100 illustrated in FIG. 1 may be a system on chip (SoC), a single field-programmable gate array (FPGA), an application-specific integrated circuit (ASIC), and so forth.

The semiconductor device 100 includes multiple I/O-cell IOCs and IOCPs, and an inner circuit region INTR. An I/O-cell IOC refers to an interface circuit for signals SIG, such as input signals, output signals, or input/output signals. An I/O-cell IOCP refers to an interface circuit for power supply voltages or grounding voltages.

The I/O-cell IOCs and IOCPs are connected to the inner circuit region INTR. For example, the inner circuit region INTR includes one or more standard cell blocks SCB, in which standard cells are provided. Note that the inner circuit region INTR may be equipped with logic circuits other than standard cells, and may also be equipped with memories. The memories may be mounted in the standard cell blocks SCB. For example, the transistors mounted on the semiconductor device 100 are FinFETs.

Figure 2:
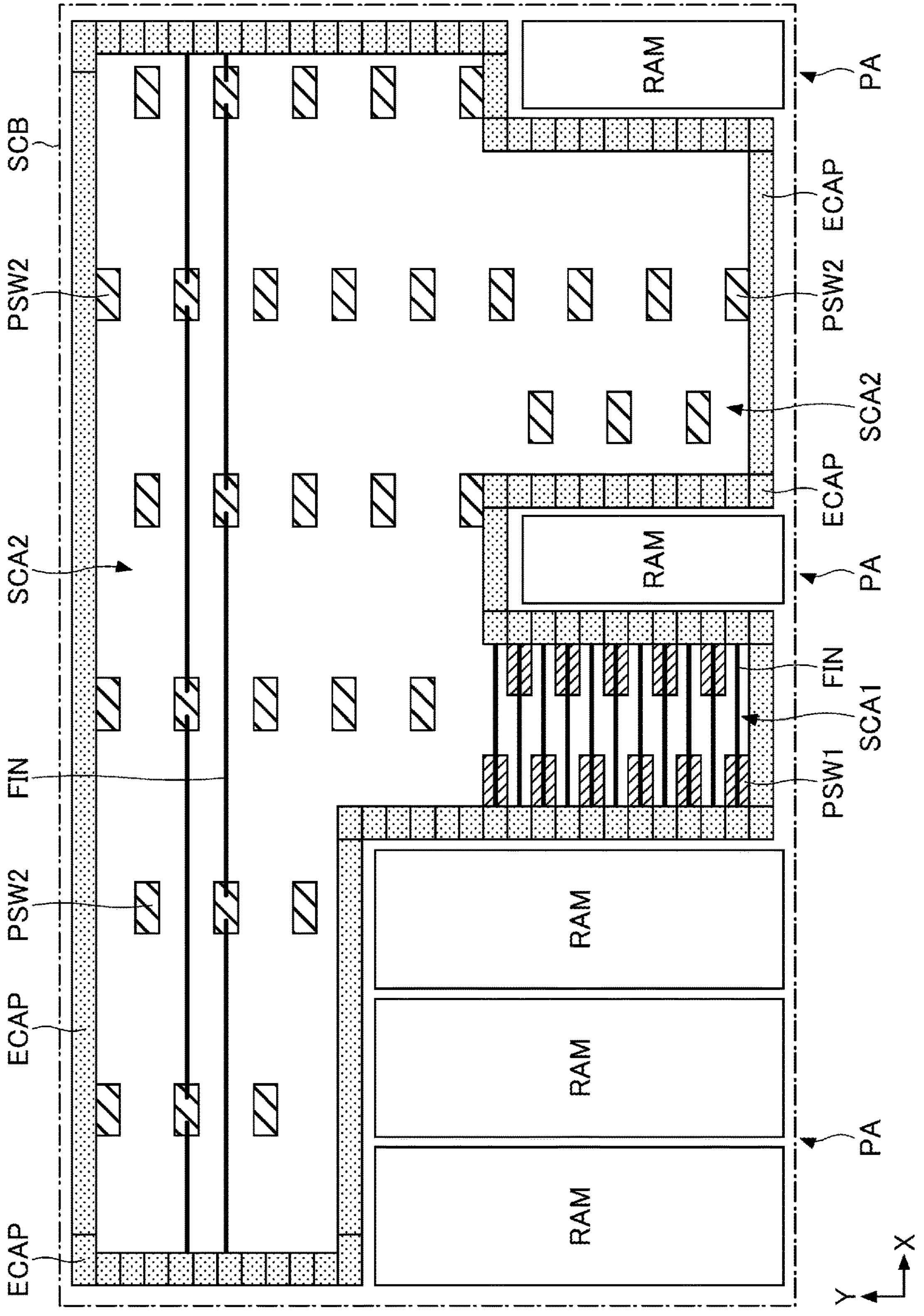
FIG. 2 is a circuit block diagram that illustrates an overview of circuits positioned in the standard cell blocks of FIG. 1.

FIG. 2 illustrates an overview of circuits positioned in the standard cell blocks SCB of FIG. 1. For example, a standard cell block SCB includes standard cell regions SCA (SCA 1 and SCA 2) in which multiple standard cells are positioned, and end caps ECAP positioned around the standard cell regions SCA. The standard cell regions SCA (SCA 1 and SCA 2) are examples of circuit regions to be provided on the substrate of the semiconductor device 100.

In the standard cell region SCA 1, multiple power supply switching circuits PSW 1, illustrated with a diagonally shaded rectangular pattern, are positioned at intervals. In the standard cell region SCA 2, multiple power supply switching circuits PSW 2, illustrated with a diagonally shaded rectangular pattern, are positioned at intervals. The standard cell region SCA 1 is an example of a first circuit region, and the standard cell region SCA 2 is an example of a second circuit region. The power supply switching circuit PSW 1 is an example of a first power supply switching circuit. The power supply switching circuit PSW 2 is an example of a second power supply switching circuit.

In the standard cell region SCA 1, standard cells are positioned in regions where no power supply switching circuit PSW 1 is positioned. In the standard cell region SCA 2, standard cells are positioned in regions where no power supply switching circuit PSW 2 is positioned.

Although, in FIG. 2, the region where the power supply switching circuits PSW 1 are included is referred to as "standard cell region SCA 1," and the region where the power supply switching circuits PSW 2 are included is referred to as "standard cell region SCA 2" for ease of explanation, there is no distinct boundary between the standard cell regions SCA 1 and SCA 2. The fins FIN protrude from the substrate of the semiconductor device 100, and are formed to extend in the X direction in plan view of the plane illustrated in the X direction and the Y direction in FIG. 2. Note that the fins FIN in FIG. 2 are illustrated for illustrative purposes only. In the standard cell regions SCA, many fins other than the fins illustrated in FIG. 2 are positioned side by side in the Y direction.

The standard cell region SCA 1 is sandwiched by end caps ECAP from its both ends in the X direction, and its width in the X direction is less than or equal to the upper limit value for the length of fins determined in the layout rules. For example, the upper limit value is provided so as to form FinFETs with desired electrical characteristics, and is an example of a first width.

The standard cell region SCA 2 is sandwiched by end caps ECAP from its both ends in the X direction, and its width in the X direction is greater than the upper limit value. Here, in regions where the width in the X direction is less than or equal to the upper limit value, the fins FIN extending in the X direction need not be cut. In regions where the width in the X direction is greater than the above upper limit value, the fins FIN extending in the X direction need to be cut into multiple sections.

For example, in the standard cell region SCA 1, multiple power supply switching circuits PSW 1 are positioned at one end and at the other end of the standard cell region SCA 1 in the X direction, thus positioned alternately in the Y direction. That is, the power supply switching circuits PSW 1 are positioned on both sides of the standard cell region SCA 1 in the X direction. In other words, the power supply switching circuits PSW 1 are positioned next to the end caps ECAP positioned on both sides of the standard cell region SCA 1 in the X direction.

By positioning the power supply switching circuits PSW 1 on both sides of the standard cell region SCA 1 in the X direction, standard cells can be positioned efficiently in the standard cell region SCA 1. Also, by positioning multiple power supply switching circuits PSW 1 alternately at one end and at the other end of the standard cell region SCA 1 in the X direction, following the Y direction, it is possible to prevent a virtual power supply voltage VVDD from being fed unevenly between individual locations in the standard cell region SCA 1.

A fin FIN provided to penetrate a power supply switching circuit PSW 1 does not pass through another power supply switching circuit PSW 1. Note that, in FIG. 2, each power supply switching circuit PSW 1 is provided with one fin FIN, but, in reality, multiple fins FIN may be provided in each power supply switching circuit PSW 1. The X direction is an example of a first direction, and the Y direction is an example of a second direction. A fin FIN that passes through a power supply switching circuits PSW 1 is an example of a first fin.

The fin FIN formed to penetrate each power supply switching circuit PSW 1 is continuous from one end of the standard cell region SCA 1 in the X direction to the other end, without getting cut off in the middle in the power supply switching circuit PSW 1. Note that the power supply switches PSW 1 may be provided, following the Y direction, only at one end or the other end of the standard cell region SCA 1 in the X direction. Alternatively, the power supply switches PSW 1 may be provided at the center of the standard cell region SCA 1 in the X direction, following the Y direction. Furthermore, the power supply switches PSW 1 may be provided, following the Y direction, at different positions in the standard cell region SCA 1 in the X axis direction.

A fin FIN that is provided to penetrate a power supply switching circuit PSW 2 is cut off in the middle inside the power supply switching circuit PSW 2. That is, the standard cell region SCA 2 includes multiple fins FIN that are positioned linearly following the X direction. A fin FIN that passes through a power supply switching circuit PSW 2 is an example of a second fin. Hereinafter, parts in which multiple fins FIN that are provided linearly following the X direction are cut off in the middle will be also referred to as "fin-cut parts." A fin-cut part is an example of a cut part in which a fin FIN is cut in the middle.

By positioning power supply switching circuits PSW 2 including fin-cut parts therein in the standard cell region SCA 2, it is possible to reduce the number of fin-cut parts to be provided in regions where standard cells are to be positioned. As a result of this, in the standard cell region SCA 2, it is possible to avoid reducing the regions in which standard cells can be positioned. On the other hand, by positioning power supply switching circuits PSW 1 not including fin-cut parts therein in the standard cell region SCA 1, it is possible to increase the regions in which standard cells can be positioned, compared to when power supply switching circuits with fin-cut parts are positioned.

FIG. 2 only illustrates fins FIN that are provided on the same line following the X direction, in the standard cell region SCA 2. However, in reality, the fins FIN may be provided to penetrate power supply switching circuits PSW 2. The fins FIN positioned in the standard cell region SCA 2 are each connected with at least one of the power supply switching circuits PSW 2.

Note that, when there are no power supply switching circuits PSW 2 in the direction in which a fin extends, or when a fin FIN that does not pass through a power supply switching circuit PSW 2 is provided, fin-cut parts may be provided in regions in the standard cell region SCA 2 where standard cells are to be positioned.

Figure 3:
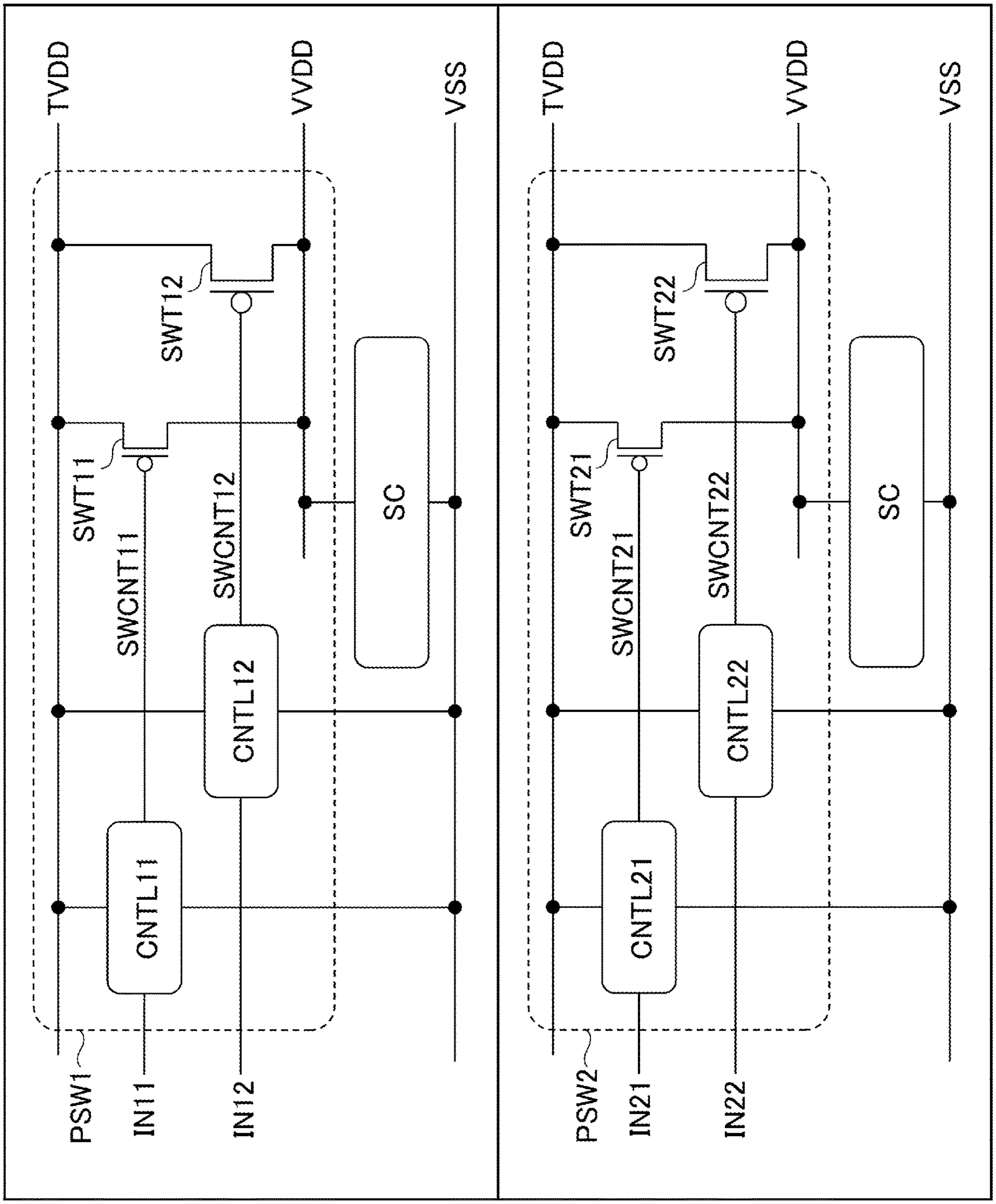
FIG. 3 is a circuit block diagram that illustrates examples of the power supply switching circuits of FIG. 2.

FIG. 3 illustrates examples of the power supply switching circuits PSW 1 and PSW 2 of FIG. 1. Each power supply switching circuit PSW 1 or PSW 2 controls feeding of power supply voltages from a power supply line TVDD to a virtual power supply line VVDD. Power supply voltages fed to the power supply line TVDD are fed to the standard cells SC provided in the standard cell regions SCA via the virtual power supply line VVDD. Each standard cell SC has multiple elements such as transistors (not illustrated) positioned between the virtual power supply line VVDD and the grounding line VSS. The power supply line TVDD is an example of a first power supply line, and the virtual power supply line VVDD is an example of a second power supply line.

The power supply switching circuit PSW 1 includes control circuits CNTL 11 and CNTL 12 and switching transistors SWT 11 and SWT 12. The control circuit CNTL 11 receives an input signal IN 11 and outputs a switch control signal SWCNT 11 in response to the received input signal IN 11. The control circuit CNTL 12 receives an input signal IN 12 and outputs a switch control signal SWCNT 12 in response to the received input signal IN 12.

The switching transistors SWT 11 and SWT 12 are p-channel transistors whose sources are connected to the power supply line TVDD, and whose drains are connected to the virtual power supply line VVDD. For example, the drive capability of the switching transistor SWT 11 is lower than that of the switching transistor SWT 12. The transistors in FIG. 3 have varying sizes, indicating that their drive capabilities vary. The switching transistors SWT 11 and SWT 12 are examples of first transistors. The switching transistor SWT 11 is an example of a first weak transistor, and the switching transistor SWT 12 is an example of a first strong transistor.

In FIG. 3, one switching transistor SWT 11 and one switching transistor SWT 12 are illustrated for ease of explanation. In reality, each switching transistor SWT 11 or SWT 12 may include multiple transistors.

The switching transistor SWT 11 turns on while receiving a low-level switch control signal SWCNT 11 from the control circuit CNTL 11 at its gate, and electrically connects the power supply line TVDD to the virtual power supply line VVDD. The switching transistor SWT 11 turns off while receiving a high-level switch control signal SWCNT 11 from the control circuit CNTL 11 at its gate, and disconnects the power supply line TVDD and the virtual power supply line VVDD.

The switching transistor SWT 12 turns on while receiving a low-level switch control signal SWCNT 12 from the control circuit CNTL 12 at its gate, and electrically connects the power supply line TVDD to the virtual power supply line VVDD. The switching transistor SWT 12 turns off while receiving a high-level switch control signal SWCNT 12 from the control circuit CNTL 12 at its gate, and disconnects the power supply line TVDD and the virtual power supply line VVDD.

The control circuits CNTL 11 and CNTL 12 are connected to the power supply line TVDD and the grounding line VSS, and operate by receiving the power supply voltage TVDD. When operating the circuits of standard cells SC, the control circuits CNTL 11 and the CNTL 12 set both of the switch control signals SWCNT 11 and SWCNT 12 to the low level, and feed power supply voltages from power supply line VDD to the virtual power supply line VVDD. When stopping the operation of the circuits of standard cells SC, the control circuits CNTL 11 and CNTL 12 set both of the switch control signals SWCNT 11 and SWCNT 12 to the high level, and stop feeding power supply voltages from the power supply line VDD to the virtual power supply line VVDD.

The power supply switching circuit PSW 2 includes control circuits CNTL 21 and CNTL 22 and switching transistors SWT 21 and SWT 22. The control circuit CNTL 21 receives an input signal IN 21 and outputs a switch control signal SWCNT 21 in response to the received input signal IN 21. The control circuit CNTL 22 receives an input signal IN 22 and outputs a switch control signal SWCNT 22 in response to the received input signal IN 22.

The switching transistors SWT 21 and SWT 22 are p-channel transistors whose sources are connected to the power supply line TVDD and whose drains are connected to the virtual power supply line VVDD. For example, the drive capability of the switching transistor SWT 21 is lower than that of the switching transistor SWT 22. The switching transistors SWT 21 and SWT 22 are examples of second transistors. The switching transistor SWT 21 is an example of a second weak transistor, and the switching transistor SWT 22 is an example of a second strong transistor.

In FIG. 3, one switching transistor SWT 21 and one switching transistor SWT 22 are illustrated for ease of explanation. However, in reality, each switching transistor SWT 21 or SWT 22 may include multiple transistors. The circuit structure of the power supply switching circuit PSW 2 is the same as or similar to the circuit structure of the power supply switching circuit PSW 1.

The switching transistor SWT 21 turns on while receiving a low-level switch control signal SWCNT 21 from the control circuit CNTL 21 at its gate, and electrically connects the power supply line TVDD to the virtual power supply line VVDD. The switching transistor SWT 21 turns off while receiving a high-level switch control signal SWCNT 21 from the control circuit CNTL 21 at its gate, and disconnects the power supply line TVDD and the virtual power supply line VVDD.

The switching transistor SWT 22 turns on while receiving a low-level switch control signal SWCNT 22 from the control circuit CNTL 22 at its gate, and electrically connects the power supply line TVDD to the virtual power supply line VVDD. The switching transistor SWT 22 turns off while receiving a high-level switch control signal SWCNT 22 from the control circuit CNTL 22 at its gate, and disconnects the power supply line TVDD and the virtual power supply line VVDD.

The control circuits CNTL 21 and CNTL 22 are connected to the power supply line TVDD and the grounding line VSS, and operate by receiving the power supply voltage TVDD. When operating the circuits of standard cells SC, the control circuits CNTL 21 and CNTL 22 set both of the switch control signals SWCNT 21 and SWCNT 22 to the low level, and feed power supply voltages from the power supply line VDD to the virtual power supply line VVDD. When stopping the operation of the circuits of standard cells SC, the control circuits CNTL 21 and CNTL 22 set both of the switch control signals SWCNT 21 and SWCNT 22 to the high level, and stop feeding power supply voltages from the power supply line VDD to the virtual power supply line VVDD.

Figure 4:
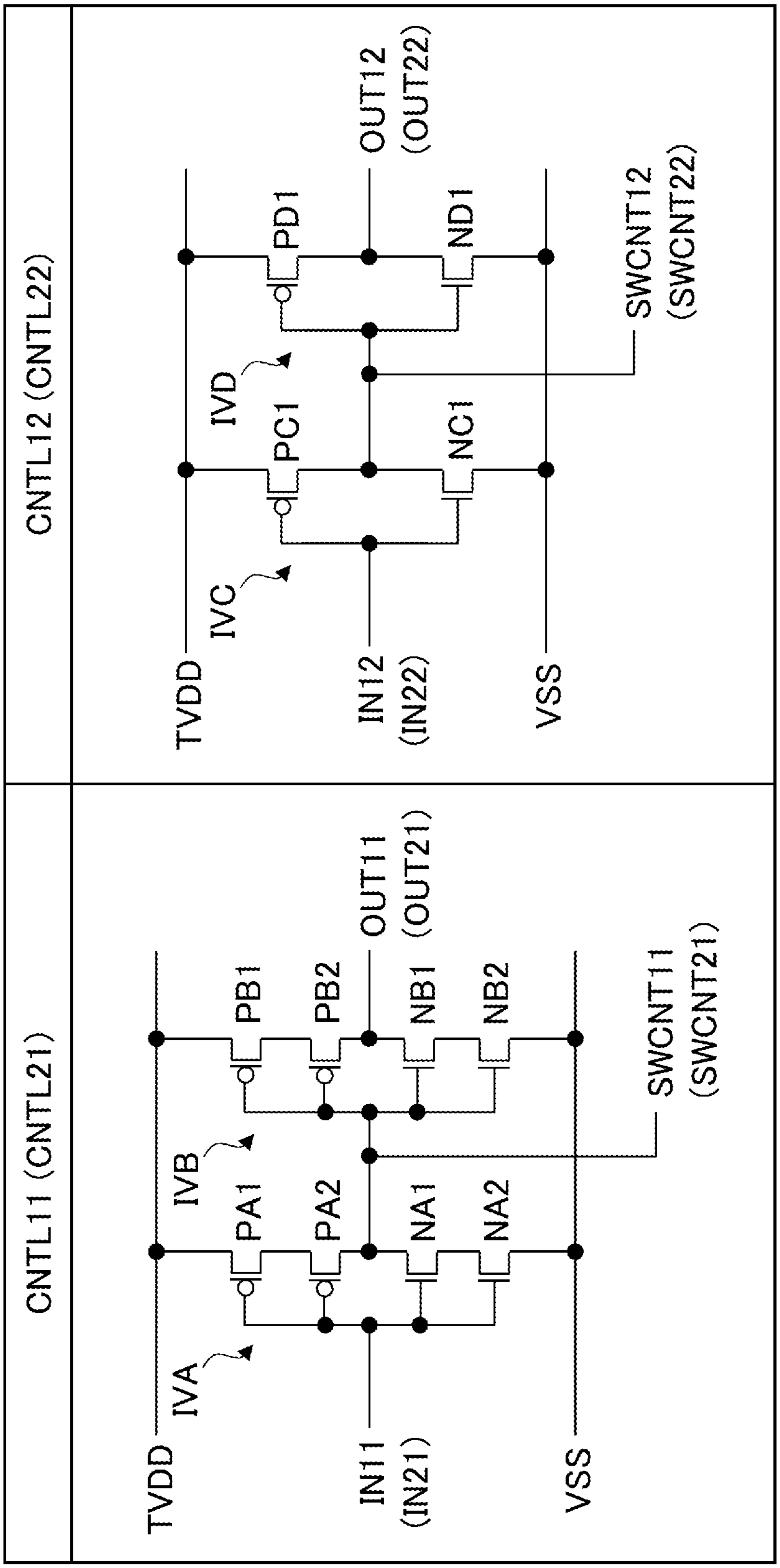
FIG. 4 is a circuit diagram that illustrates examples of the control circuits of FIG. 3.

FIG. 4 illustrates examples of the control circuits CNTL 11, CNTL 12, CNTL 21, and CNTL 22 of FIG. 3. In the example illustrated in FIG. 4, the control circuits CNTL 11 and CNTL 21 have the same circuit structure, and the control circuits CNTL 12 and CNTL 22 have the same circuit structure. Therefore, in the following description, the circuit structures of the control circuits CNTL 11 and CNTL 12 will be explained, and signals that are specific to the control circuits CNTL 21 and CNTL 22 will be illustrated in parentheses.

The control circuit CNTL 11 is a buffer circuit including inverters IVA and IVB, which are connected in series between the input signal line IN 11 and the output signal line OUT 11. The inverter IVA includes p-channel transistors PA 1 and PA 2 and n-channel transistors NA 1 and NA 2, which are connected in series between the power supply line TVDD and the grounding line VSS.

The gates of the p-channel transistors PA 1 and PA 2 and n-channel transistors NA 1 and NA 2 are connected to an input signal line IN 11. The drains of the p-channel transistor PA 1 and the n-channel transistor NA 1 are connected to a switch control signal line SWCNT 11 and an input of the inverter IVB.

The inverter IVB includes p-channel transistors PB 1 and PB 2 and n-channel transistors NB 1 and NB 2, which are connected in series between the power supply line TVDD and the grounding line VSS. The gates of the p-channel transistors PB 1 and PB 2 and the n-channel transistors NB 1 and NB 2 are connected to an output of the inverter IVA. The drains of the p-channel transistor PB 2 and the n-channel transistors NB 1 are connected to an output signal line OUT 11.

The control circuit CNTL 11 inverts the logic level of the input signal IN 11 and feeds it to the gate of the switching transistor SWT 11 in FIG. 3, as the switch control signal SWCNT 11. Also, the control circuit CNTL 11 outputs a signal of the same logic level as the input signal IN 11 to a subsequent control circuit or the like, as the output signal OUT 11. The control circuit CNTL 21 inverts the logic level of the input signal IN 21 and feeds it to the gate of the switching transistor SWT 21 of FIG. 3, as the switch control signal SWCNT 21. Also, the control circuit CNTL 21 outputs a signal of the same logic level as the input signal IN 21 to a subsequent control circuit or the like, as the output signal OUT 21.

The control circuit CNTL 12 is a buffer circuit including inverters IVC and IVD, which are connected in series between an input signal line IN 12 and an output signal line OUT 12. The inverter IVC has a p-channel transistor PC 1 and an n-channel transistor NC 1, which are connected in series between the power supply line TVDD and the grounding line VSS.

The gates of the p-channel transistor PC 1 and n-channel transistor NC 1 are connected to the input signal line IN 12. The drains of the p-channel transistor PC 1 and n-channel transistor NC 1 are connected to the switch control signal line SWCNT 12 and an input of the inverter IVD.

The inverter IVD includes a p-channel transistor PD 1 and an n-channel transistor ND 1, which are connected in series between the power supply line TVDD and the grounding line VSS. The gates of the p-channel transistor PD 1 and the n-channel transistor ND 1 are connected to an output of the inverter IVC. The drains of the p-channel transistor PD 1 and the n-channel transistor ND 1 are connected to the output signal line OUT 12.

The control circuit CNTL 12 inverts the logic level of the input signal IN 12 and feeds it to the gate of the switching transistor SWT 12 of FIG. 3, as the switch control signal SWCNT 12. Also, the control circuit CNTL 12 outputs a signal of the same logic level as the input signal IN 12, to the subsequent control circuit or the like, as an output signal OUT 12. The control circuit CNTL 22 inverts the logic level of the input signal IN 22 and feeds it to the gate of the switching transistor SWT 22 of FIG. 3, as a switch control signal SWCNT 22. Also, the control circuit CNTL 22 outputs a signal of the same logic level as the input signal IN 22, to a subsequent control circuit or the like, as an output signal OUT 22.

Note that the inverters IVA and IVB may each include an odd number of inverters connected in series between the input and the output. Similarly, the inverters IVC and IVD may each include an odd number of inverters connected in series between the input and the output.

The inverters IVA and IVB have a larger number of transistors connected in series between the power supply line TVDD and the grounding line VSS than the inverters IVC and IVD. Therefore, the propagation delay time in the inverters IVA and IVB is longer than that in the inverters IVC and IVD.

Therefore, for example, when setting the rising timings of the input signals IN 11 and IN 12 to be the same, the falling timing of the switch control signal SWCNT 11 can be delayed from the falling timing of the switch control signal SWCNT 12. Similarly, when setting the rising timings of the input signals IN 21 and IN 22 to be the same, the falling timing of the switch control signal SWCNT 21 can be delayed from the falling timing of the switch control signal SWCNT 2.

By shifting the falling timings of the switch control signals SWCNT 11 and SWCNT 12 thus, the switching transistors SWT 11 and SWT 12 are turned on at different timings. By this means, the power supply noise that is produced when the switching transistors SWT 11 and SWT 12 are turned on can be reduced. Similarly, by shifting the falling timings of the switch control signals SWCNT 21 and SWCNT 22, it is possible to reduce the power supply noise that is produced when the switching transistors SWT 21 and SWT 22 are turned on.

Figure 5:
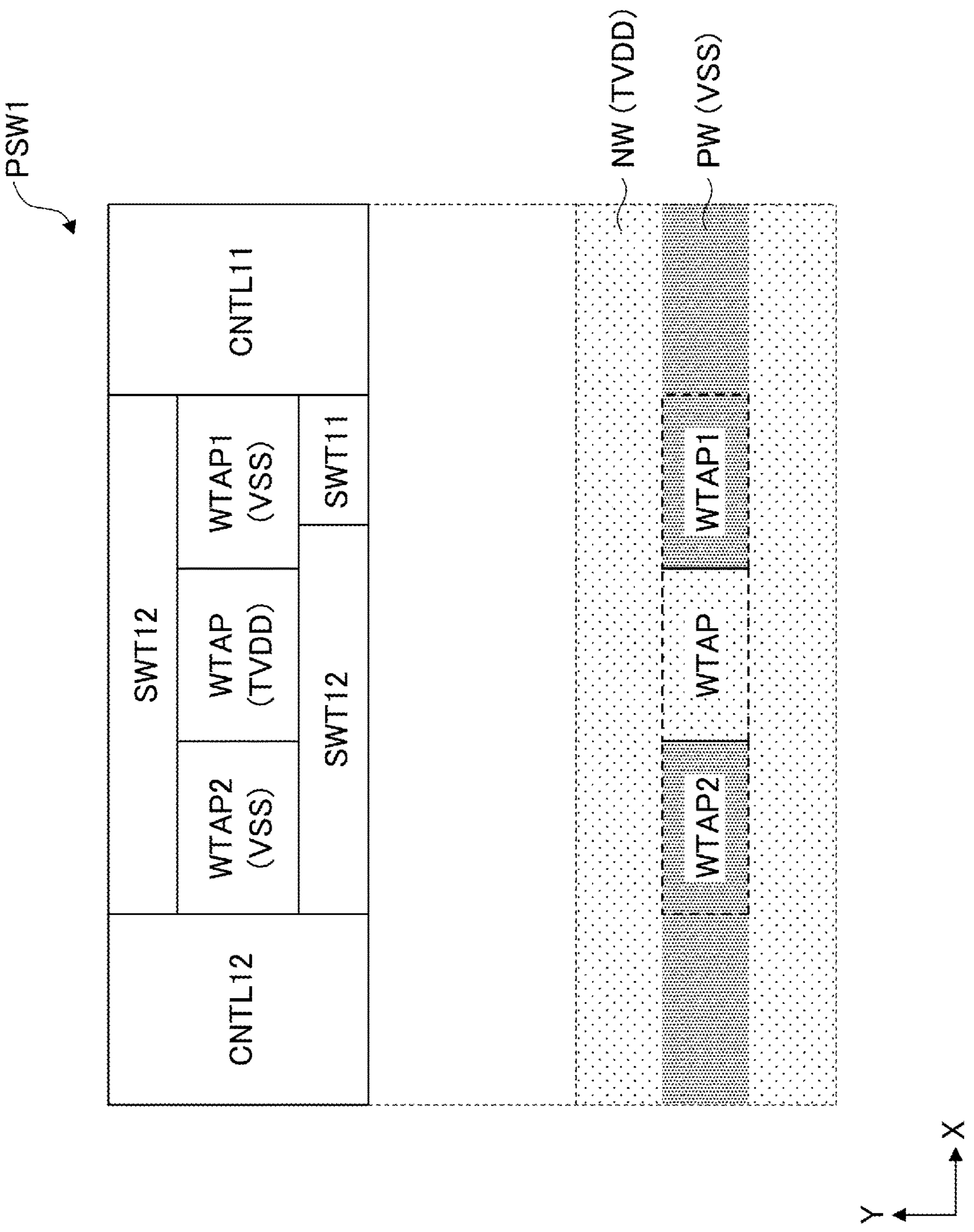
FIG. 5 is an explanatory diagram that illustrates an example layout of circuit blocks in the power supply switching circuit PSW 1 of FIG. 3 and an example power feeding from well taps to a substrate.

FIG. 5 illustrates an example layout of circuit blocks in the power supply switching circuit PSW 1 of FIG. 3 and an example power feeding from well taps to a substrate. The control circuits CNTL 11 and CNTL 12 are positioned, respectively, at one end and at the other end of the power supply switching circuit PSW 1 in the X direction.

Well taps WTAP 1 (VSS), WTAP (TVDD), and WTAP 2 (VSS), and switching transistors SWT 11 and SWT 12 are positioned between the control circuits CNTL 11 and CNTL 12. The well taps WTAP 1 (VSS), WTAP (TVDD), and WTAP 2 (VSS) are positioned at the center in the Y direction, and positioned side by side, in the X direction, between the control circuits CNTL 11 and CNTL 12. By providing the well taps WTAP 1 (VSS), WTAP (TVDD), and WTAP 2 (VSS) in the power supply switching circuit PSW 1, it is possible to reduce the area of well taps to be positioned in regions where standard cells are to be positioned.

The switching transistors SWT 12 are positioned next to the well taps WTAP 1 (VSS), WTAP (TVDD), and WTAP 2 (VSS), at one end and at the other end of the power supply switching circuit PSW 1 in the Y direction. The switching transistor SWT 11 is positioned next to the well tap WTAP 1 (VSS), at the other end of the power supply switching circuit PSW 2 in the Y direction. The switching transistors SWT 11 and SWT 12 at the other end in the Y direction are positioned side by side in the X direction.

The well tap WTAP (TVDD) electrically connects a power supply line TVDD (not illustrated) to an n-type well region NW formed in the substrate of the semiconductor device 100, and feeds a power supply voltage TVDD to the n-type well region NW. The well taps WTAP 1 (VSS) and WTAP 2 (VSS) electrically connect a grounding line VSS (not illustrated) to a p-type well region PW formed in the substrate of the semiconductor device 100, and feed a grounding voltage VSS to the p-type well region PW.

The well tap WTAP (TVDD) is an example of a first well tap. The well taps WTAP 1 (VSS) and WTAP 2 (VSS) are examples of second well taps. The n-type well region NW is an example of a first well region of a first type of conductivity. The p-type well region PW is an example of a second well region of a second type of conductivity. The power supply voltage TVDD is an example of a first voltage. The grounding voltage VSS is an example of a second voltage.

Note that the well taps WTAP 1 (VSS) and WTAP 2 (VSS) are not only electrically connected to the p-type well regions PW of the power supply switching circuit PSW 1, but are also electrically connected to the p-type well regions PW located on both sides of the power supply switching circuit PSW 1 in the X direction. Similarly, the well tap WTAP (TVDD) is not only electrically connected to the n-type well regions NW of the power supply switching circuit PSW 1, but is also electrically connected to the n-type well regions NW located on both sides of the power supply switching circuit PSW 1 in the X direction.

Figure 6:
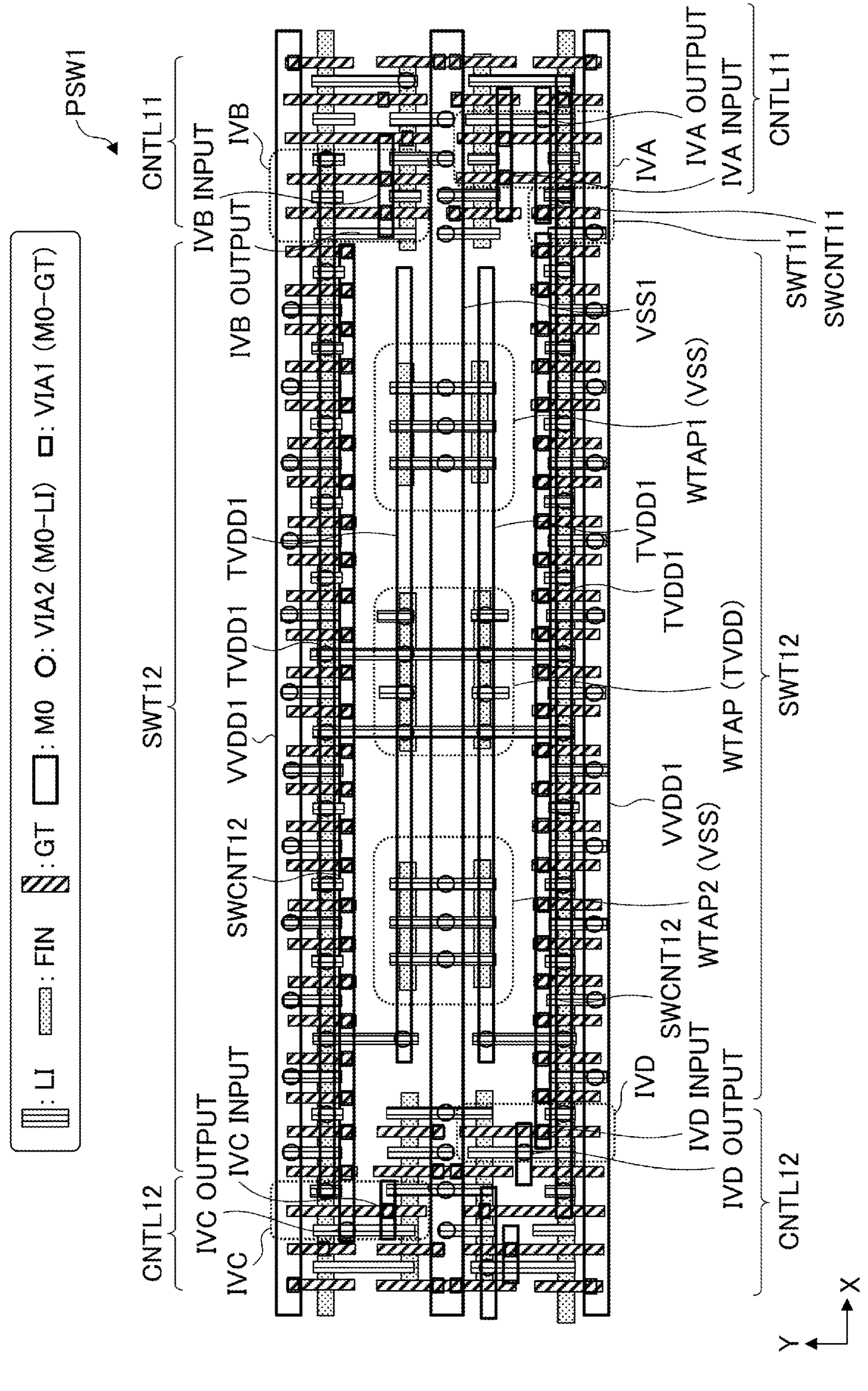
FIG. 6 is a plan view that illustrates an example layout of the power supply switching circuit of FIG. 5.

FIG. 6 illustrates an example layout of the power supply switching circuit PSW 1 of FIG. 5. Gate lines GT, connected to each transistor's gate, are extended following the Y direction in FIG. 6. Fins FIN are extended following the X direction in FIG. 6. Local lines L1, located in a layer above the gate lines GT, are extended following the Y direction in FIG. 6. Metal lines M0, located in a layer above the local lines L1, are extended in the X direction in FIG. 6.

The metal lines M0 and the gate lines GT are connected with each other through vias VIA 1. The metal lines M0 and the local lines L1 are connected with each other through vias VIA 2. Note that multiple other layers of metal lines (not illustrated) may be formed in layers above the metal lines M0.

For example, in the gate lines GT, vias VIA 1 that are not connected with the metal lines M0 may be connected with metal lines in a layer above the metal lines M0. In the local lines L1, vias VIA 2 that are not connected with the metal lines M0 may be connected with metal lines in a layer above the metal lines M0.

Power supply lines TVDD 1, to which power supply voltages TVDD are fed, virtual power supply lines VVDD 1, to which virtual power supply voltages VVDD are fed, and a grounding line VSS 1, to which a grounding voltage VSS is fed are formed with the metal lines M0. Note that the power supply lines TVDD 1, the virtual power supply lines VVDD 1, and the grounding line VSS 1 may be connected with metal lines in a layer above the metal lines M0, via the metal lines M0.

Each transistor is formed in a part where fins FIN that extend in the X direction and the gate lines GT that extend in the Y direction and spanning the fins FIN cross. The source and drain of the transistor are formed on both sides of the crossing part of each fin FIN. The source and drain are connected directly to local lines L1.

The switching transistor SWT 11 is positioned next to the inverter IVA. The gate of the switching transistor SWT 11 is connected to an output of the inverter IVA via the switch control signal line SWCNT 11 formed with a metal line M0. The output of the inverter IVA is connected to an input of the inverter IVB via a metal line of an upper layer (not illustrated).

The switching transistor SWT 12 is formed by connecting, in parallel, multiple transistors that are positioned following the X direction, on both sides of the power supply switching circuit PSW 1 in the Y direction. The gate of the switching transistor SWT 12, formed on the inverter IVC's side in the Y direction, is connected to an output of the inverter IVC via the switch control signal line SWCNT 12 formed with a metal line M0. The output of the inverter IVC is connected to the input of the inverter IVD via a metal line of an upper layer (not illustrated).

The gate of the switching transistor SWT 12, formed on the inverter IVD's side in the Y direction, is connected to the input of the inverter IVD (that is, the output of the inverter IVC) via the switch control signal line SWCNT 12 formed with a metal line M0.

Each of the well taps WTAP 1 (VSS) and WTAP 2 (VSS) electrically connects the grounding line VSS 1, which is formed with a metal line M0, to the p-type well region PW illustrated in FIG. 5, through multiple vias VIA 2, multiple local lines L1, and multiple fins FIN. The fins FIN positioned in the regions of the well taps WTAP 1 (VSS) and WTAP 2 (VSS) are formed as p-type diffusion layers.

The well tap WTAP (TVDD) electrically connects multiple power supply lines TVDD 1, formed with the metal lines M0, to the n-type well region NW illustrated in FIG. 5, through multiple vias VIA 2, multiple local lines L1, and multiple fins FIN. The fins FIN positioned in the region of the well tap WTAP (TVDD) are formed as an n-type diffusion layer. Note that the metal lines M0 for feeding power to the well tap WTAP (TVDD), which is extended on the well taps WTAP 1 (VSS) and WTAP 2 (VSS), may be omitted.

Figure 7:
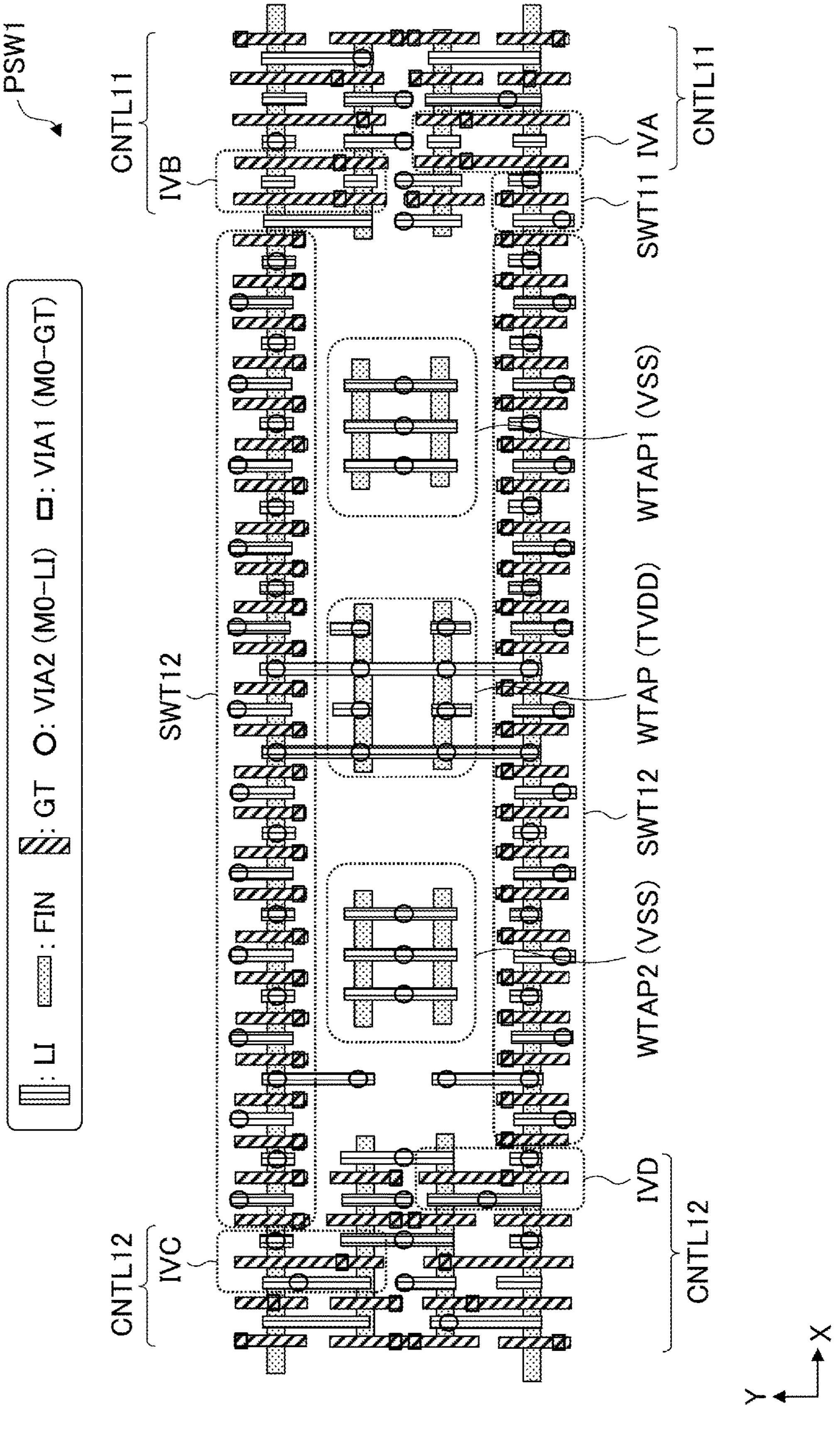
FIG. 7 is a plan view that illustrates a layout of the fins, gate lines, local lines, and vias of FIG. 6.

FIG. 7 illustrates a layout of the fins FIN, gate lines GT, local lines L1, and vias VIA 1 and VIA 2 of FIG. 6. FIG. 7 is the same as FIG. 6 except that the metal lines M0 are removed from the layout of FIG. 6.

The fins FIN located in the center in the regions of the control circuits CNTL 11 and CNTL 12 in the Y direction are formed for n-channel transistors. The fins positioned on both sides in the Y direction are formed for p-channel transistors.

Figure 8:
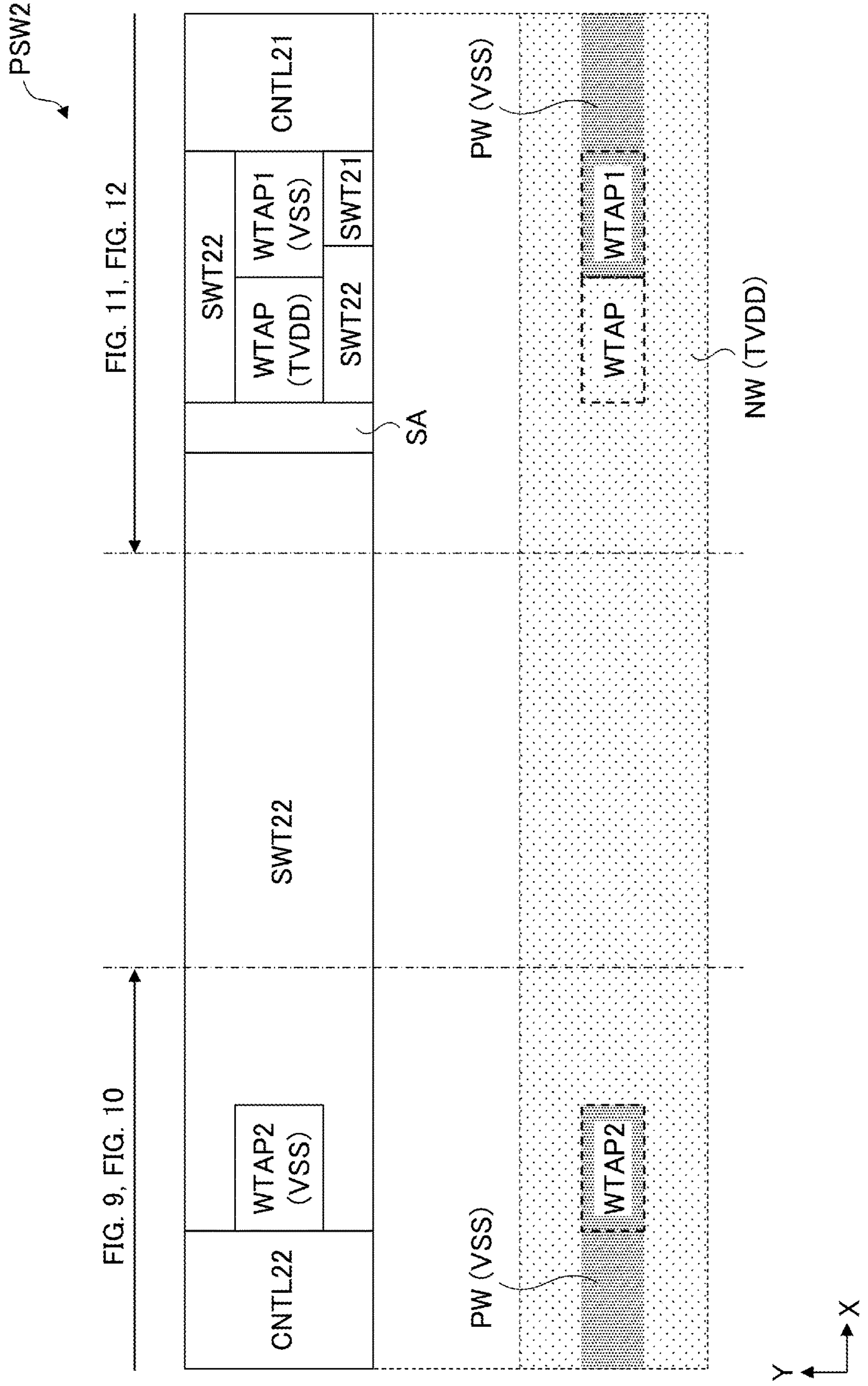
FIG. 8 is an explanatory diagram that illustrates an example layout of circuit blocks in the power supply switching circuit PSW 2 of FIG. 3 and an example power feeding from well taps to a substrate.

FIG. 8 illustrates an example layout of circuit blocks in the power supply switching circuit PSW 2 of FIG. 3 and an example power feeding from well taps to a substrate. The control circuits CNTL 21 and CNTL 22 are positioned, respectively, at one end and at the other end of the power supply switching circuit PSW 2 in the X direction.

Well taps WTAP 1 (VSS), WTAP (TVDD), and WTAP 2 (VSS), switching transistors SWT 21 and SWT 22, and a separating region SA are positioned between the control circuits CNTL 21 and CNTL 22. The well tap WTAP 1 (VSS) is positioned next to the control circuit CNTL 21 at the center in the Y direction. The well tap WTAP (TVDD) is positioned next to the well tap WTAP 1 (VSS) at the center in the Y direction. The well tap WTAP 2 (VSS) is positioned next to the control circuit CNTL 22 at the center in the Y direction. By providing the well taps WTAP 1 (VSS), WTAP (TVDD), and WTAP 2 (VSS) in the power supply switching circuit PSW 2, it is possible to reduce the area of well taps to be positioned in regions where standard cells are to be positioned.

A part of the switching transistor SWT 22 is positioned next to the well taps WTAP 1 (VSS) and WTAP (TVDD), at one end and at the other end of the power supply switching circuit PSW 2 in the Y direction. The rest of the switching transistor SWT 22 is positioned in the power supply switching circuit PSW 2, on both sides of the well tap WTAP 2 (VSS) in the Y direction, and in the region between the well tap WTAP 2 (VSS) and the separating region SA.

The switching transistor SWT 21 is positioned next to the well tap WTAP 1 (VSS) at the other end of the power supply switching circuit PSW 2 in the Y direction. The switching transistors SWT 21 and SWT 22, positioned at the other end in the Y direction, are positioned side by side in the X direction.

Figure 11:
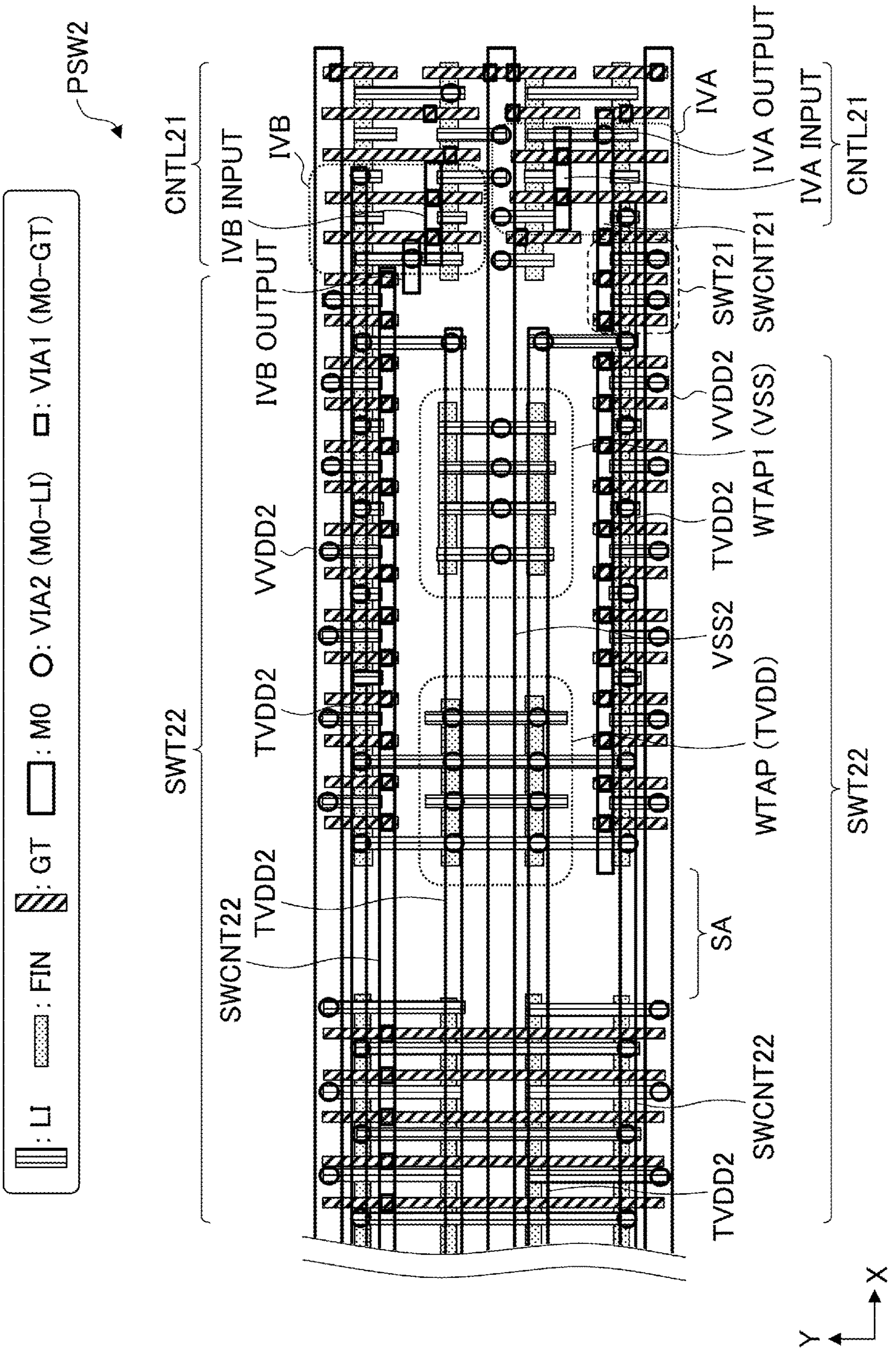
FIG. 11 is a plan view that illustrates an example layout of the control circuit CNTL 21 side in the power supply switching circuit of FIG. 8.

The separating region SA is located in a part next to the well tap WTAP (TVDD), from one end to the other end in the Y direction. As illustrated in FIG. 11, the separating region SA is a part (fin-cut part) where no fins FIN are formed.

As in FIG. 5, the well taps WTAP 1 (VSS) and WTAP 2 (VSS) connect a grounding line VSS (not illustrated) to the p-type well region PW in the substrate of the semiconductor device 100. The well tap WTAP (TVDD) connects a power supply line TVDD (not illustrated) to the n-type well region NW in the substrate of the semiconductor device 100.

Note that, in FIG. 8, too, the well taps WTAP 1 (VSS) and WTAP 2 (VSS) are not only electrically connected to the p-type well region PW of the power supply switching circuit PSW 2, but also are electrically connected to the p-type well regions PW located on both sides of the power supply switching circuit PSW 2 in the X direction. Similarly, the well tap WTAP (TVDD) is not only electrically connected to the n-type well region NW of the power supply switching circuit PSW 2, but also is electrically connected to the n-type well regions NW located on both sides of the power supply switching circuit PSW 2 in the X direction.

Figure 9:
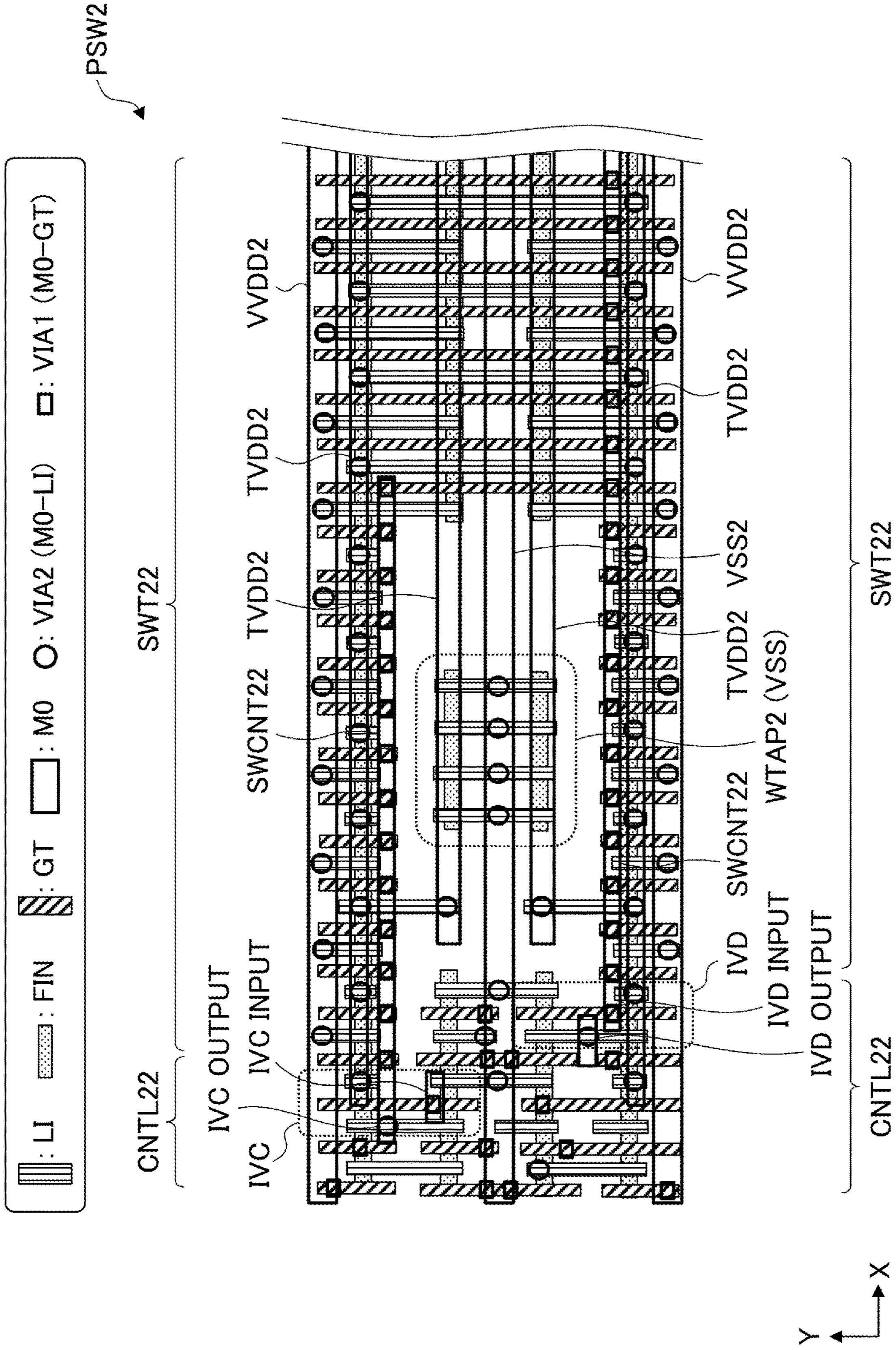
FIG. 9 is a plan view that illustrates an example layout of the control circuit CNTL 22 side in the power supply switching circuit of FIG. 8.
Figure 10:
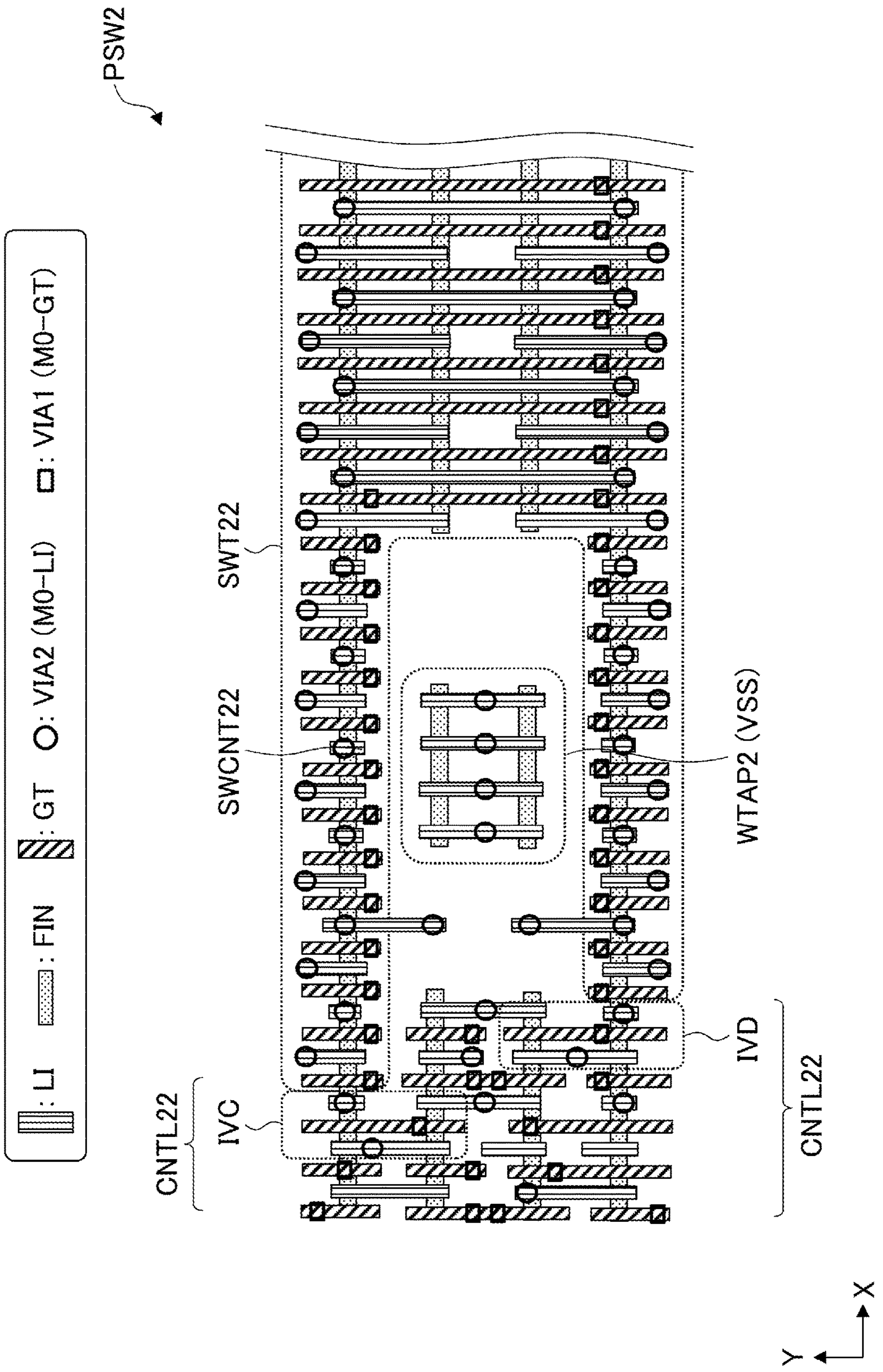
FIG. 10 is a plan view that illustrates a layout of the fins, gate lines, local lines, and vias of FIG. 9.
Figure 12:
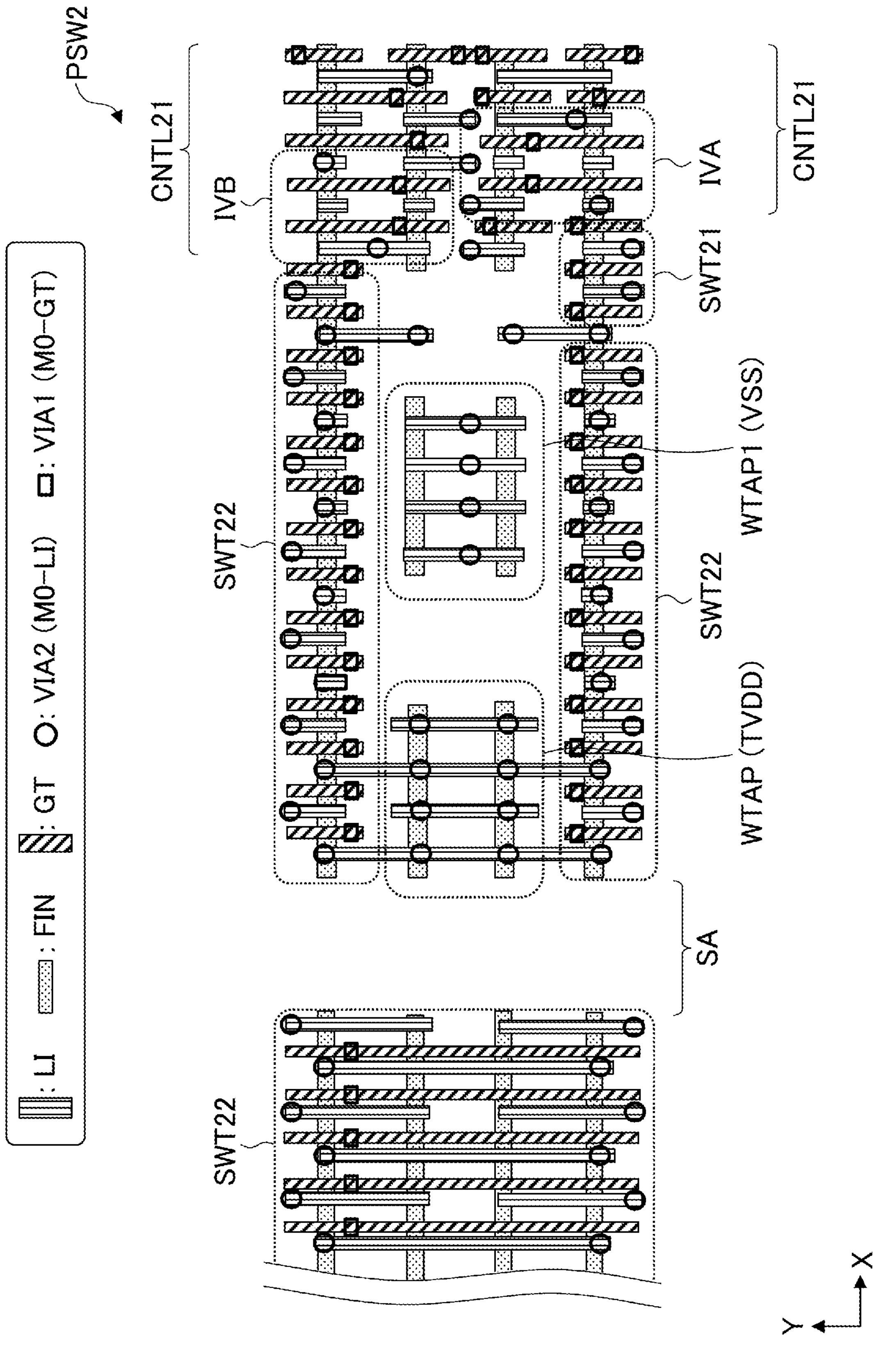
FIG. 12 is a plan view that illustrates a layout of the fins, gate lines, local lines, and vias of FIG. 11.

In the power supply switching circuit PSW 2, examples of circuit layouts on the control circuit CTRL's side are illustrated in FIG. 9 and FIG. 10. In the power supply switching circuit PSW 2, examples of circuit layouts on the control circuit CNTL 21's side are illustrated in FIG. 11 and FIG. 12.

FIG. 9 illustrates an example layout of the control circuit CNTL 22 side in the power supply switching circuit PSW 2 of FIG. 8. Elements that are the same as in FIG. 6 will be indicated by the same reference codes/numerals and patterns, and their detailed description will be omitted. The layout of the well tap WTAP 2 (VSS) is similar to the layout of the well tap WTAP 2 (VSS) in FIG. 6.

Power supply lines TVDD 2, to which power supply voltages TVDD are fed, virtual power supply lines VVDD 2, to which virtual power supply voltages VVDD are fed, and a grounding line VSS 2, to which a grounding voltage VSS is fed, are formed with the metal lines M0. Note that the power supply lines TVDD 2, virtual power supply lines VVDD 2, and grounding line VSS 2 may be connected with metal lines in a layer above the metal lines M0, via the metal lines M0.

The switching transistor SWT 22 is formed by connecting, in parallel, multiple transistors that are positioned following the X direction, on both sides of the power supply switching circuit PSW 2 in the Y direction. The gate of the switching transistor SWT 22, formed on the inverter IVC's side in the Y direction, is connected to the output of the inverter IVC via the switch control signal line SWCNT 22 formed with the metal lines M0.

The output of the inverter IVC is connected to the input of the inverter IVD via a metal line of an upper layer (not illustrated). The gate of the switching transistor SWT 22, formed on the inverter IVD's side in the Y direction, is connected to the input of the inverter IVD (that is, the output of the inverter IVC) via the switch control signal line SWCNT 22 formed with the metal lines M0.

FIG. 10 illustrates a layout of the fins FIN, gate lines GT, local lines L1, and vias VIA 1 and VIA 2 of FIG. 9. FIG. 10 is the same as FIG. 9 except that the metal lines M0 are removed from the layout of FIG. 9.

The fins FIN located in the center in the region of the control circuit CNTL 22 in the Y direction are formed for n-channel transistors. The fins FIN positioned on both sides in the Y direction are formed for p-channel transistors. Between the well tap WTAP 2 (VSS) and the well tap WTAP (TVDD) in FIG. 11, the fins FIN positioned at the center in the Y direction are formed for p-channel transistors.

FIG. 11 illustrates an example layout of the control circuit CNTL 21 side in the power supply switching circuit PSW 2 of FIG. 8. Elements that are the same as in FIG. 6 and FIG. 9 will be indicated by the same reference codes/numerals and patterns as in FIG. 6 and FIG. 9, and their detailed description will be omitted. The layout of the well tap WTAP (TVDD) and the well tap WTAP 1 (VSS) is similar to the layout of the well tap WTAP (TVDD) and the well tap WTAP 1 (VSS) in FIG. 6.

The switching transistor SWT 21 is positioned next to the inverter IVA. The gate of the switching transistor SWT 21 is connected to an output of the inverter IVA via a switch control signal line SWCNT 21 formed with a metal line M0. The output of the inverter IVA is connected to an input of the inverter IVB via a metal line of an upper layer (not illustrated).

Similar to FIG. 9, the switching transistor SWT 22 is formed by connecting in parallel multiple transistors that are positioned following the X direction on both sides of the power supply switching circuit PSW 2 in the Y direction. The gate of the switching transistor SWT 22 formed on the inverter IVB's side in the Y direction is connected to the output of the inverter IVC in FIG. 9 via the switch control signal line SWCNT 22 formed with a metal line M0. The gate of the switching transistor SWT 22, formed on the inverter IVA's side in the Y direction is connected to an input of the inverter IVD (that is, the output of the inverter IVC) in FIG. 9 via the switch control signal line SWCNT 22 formed with a metal line M0.

No fins FIN are formed in the separating region SA, and the fins FIN that extend in the X direction are cut off in the middle in the separating region SA. By providing a separating region SA in which no fins FIN are formed in the power supply switching circuit PSW 2, it is possible to reduce the number of fin-cut parts to be positioned in regions where standard cells are to be positioned, in the standard cell region SCA 2 illustrated in FIG. 2. As a result of this, the efficiency of positioning standard cells can be improved.

FIG. 12 illustrates a layout of the fins FIN, gate lines GT, local lines L1, and vias VIA 1 and VIA 2 of FIG. 11. FIG. 12 is the same as FIG. 11 except that the metal lines M0 are removed from the layout of FIG. 11.

The fins FIN positioned at the center in the region of the control circuit CNTL 21 in the Y direction are formed for n-channel transistors. The fins positioned on both sides in the Y direction are formed for p-channel transistors. As described earlier with reference to FIG. 10, the fins FIN positioned at the center in the Y direction between the well tap WTAP (TVDD) and the well tap WTAP 2 (VSS) in FIG. 9 are formed for p-channel transistors.

As described above, according to the first embodiment, power supply switching circuits PSW 1 including no fin-cut parts are positioned in a standard cell region SCA 1 whose width in the X direction is less than or equal to an upper limit value for the length of fins determined in the layout rules. Meanwhile, power supply switching circuits PSW 2, including fin-cut parts, are positioned in a standard cell region SCA 2 whose width in the X direction is greater than the upper limit value for the length of fins.

By positioning the power supply switching circuits PSW 1 including no fin-cut parts in the standard cell region SCA 1, it is possible to increase the regions where standard cells can be positioned, compared to the case in which power supply switching circuits including fin-cut parts are positioned. Also, by positioning the power supply switching circuits PSW 2 including fin-cut parts in the standard cell region SCA 2, it is possible to reduce the number of fin-cut parts to be provided in regions where standard cells are to be positioned, and thus prevent regions where standard cells can be positioned from decreasing. As a result of this, fin-cut parts can be appropriately positioned in the standard cell regions SCA 1 and SCA 2, so that the decrease in the efficiency of positioning standard cells can be reduced.

By positioning the power supply switching circuits PSW 1 on both sides of the standard cell region SCA 1 in the X direction, it is possible to prevent regions where standard cells are to be positioned from being separated, and thus to position standard cells in the standard cell region SCA 1 efficiently. In the standard cell region SCA 1, multiple power supply switching circuits PSW 1 are positioned alternately, at one end and at the other end in the X direction, following the Y direction. By this means, it is possible to prevent virtual power supply voltages VVDD from being fed unevenly between individual locations in the standard cell region SCA 1.

By providing well taps WTAP 1 (VSS), WTAP (TVDD), and WTAP 2 (VSS) in the power supply switching circuits PSW 1 and PSW 2, it is possible to reduce the area of well taps to be positioned. As a result of this, it is possible to reduce the decrease in the efficiency of positioning standard cells.

Switching transistors SWT 11 and SWT 12, whose respective drive capabilities vary, and whose drive timings can be set individually, are provided in each power supply switching circuit PSW 1. Similarly, switching transistors SWT 21 and SWT 22, whose respective drive capabilities vary, and whose drive timings can be set individually, are provided in each power supply switching circuit PSW 2. By this means, it is possible to reduce the power supply noise that is produced when virtual power supply voltages VVDD are fed to the standard cell regions SCA 1 and SCA 2 and when the supply is stopped.

Figure 13:
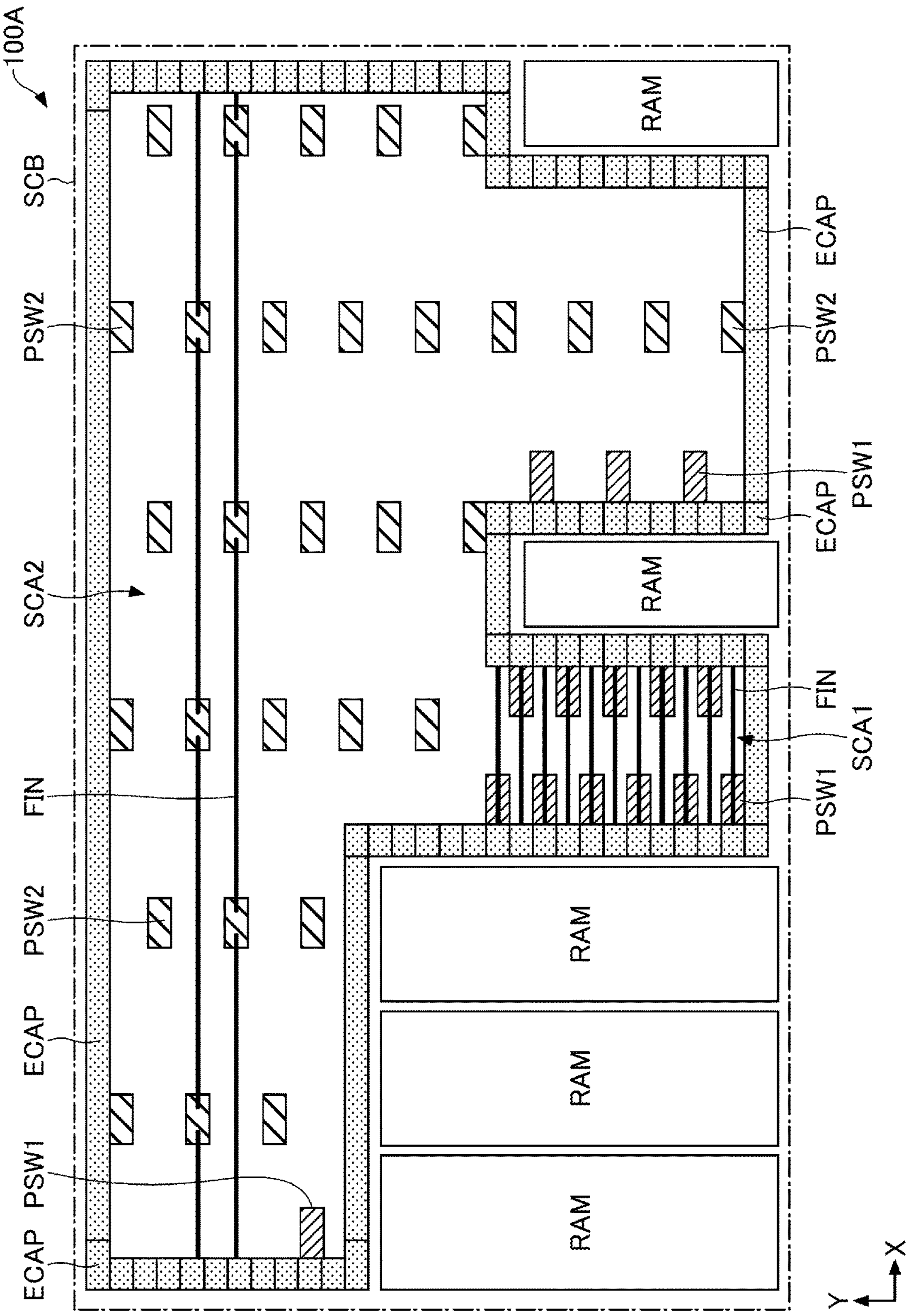
FIG. 13 is a circuit block diagram that illustrates an overview of circuits positioned in a standard cell block in a semiconductor device according to a second embodiment.

FIG. 13 illustrates an overview of circuits positioned in standard cell blocks in a semiconductor device according to a second embodiment. Detailed description of elements that are the same as in FIG. 2 will be omitted. A semiconductor device 100 A including the standard cell block SCB illustrated in FIG. 13 has the same layout as that of the semiconductor device 100 illustrated in FIG. 1.

The standard cell block SCB in FIG. 13 includes power supply switching circuits PSW 1 that are positioned next to an end cap ECAP at the end of the standard cell region SCA 2 in the X direction. That is, in FIG. 13, the power supply switching circuits PSW 1 are positioned in both of the standard cell regions SCA 1 and SCA 2. The rest of the structure of the standard cell block SCB is the same as that of the standard cell block SCB in FIG. 2.

In the standard cell region SCA 2, the ends of fins FIN are located in regions next to the end cap ECAP, and so no fin-cut part is necessary. For example, by positioning power supply switching circuits PSW 1 having no separating region SA, instead of positioning power supply switching circuits PSW 2 in regions next to the end cap ECAP, it is possible to increase the standard cells that can be mounted in the standard cell region SCA 2. As a result of this, it is possible to reduce the decrease in the efficiency of positioning standard cells. Note that, in the standard cell region SCA 2, the power supply switching circuits PSW 1 may be located at one end in the X direction, at the other end in the X direction, or at both ends in the X direction.

Figure 14:
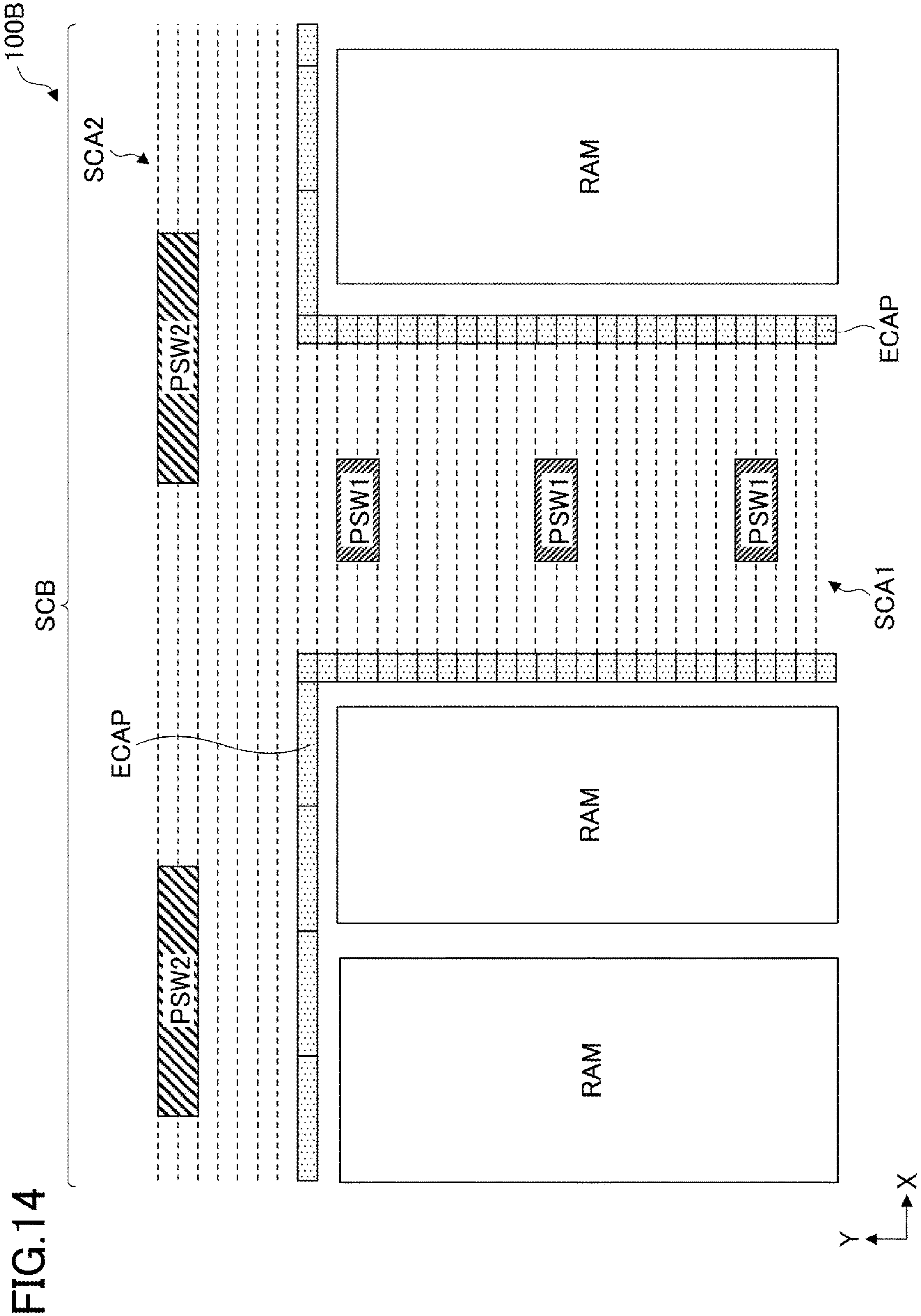
FIG. 14 is a circuit block diagram that illustrates an overview of circuits positioned in a standard cell block in a semiconductor device according to a third embodiment.

FIG. 14 illustrates an overview of circuits positioned in a standard cell block in a semiconductor device according to a third embodiment. Detailed description of elements that are the same as in FIG. 2 will be omitted. A semiconductor device 100B including the standard cell block SCB illustrated in FIG. 14 has the same layout as that of the semiconductor device 100 illustrated in FIG. 1.

In the standard cell block SCB illustrated in FIG. 14, power supply switching circuits PSW 1 are positioned at the center of the standard cell region SCA 1 in the X direction.

Note that the power supply switching circuits PSW 1 to be positioned in the standard cell region SCA 1, whose width in the X direction is less than or equal to the upper limit value for the length of fins determined in the layout rules, may be located at one end in the X direction, at the other end in the X direction, or at both ends in the X direction. For example, the locations of the power supply switching circuits PSW 1 may be determined according to the circuit characteristics (electrical characteristics, operating frequency, etc.) of the standard cells mounted in the standard cell region SCA 1.

Although the present invention has been described above based on a number of embodiments, the present invention is by no means limited to the conditions and requirements illustrated with respect to the above embodiments. These points can be changed without departing from the spirit of the present invention, and can be determined as appropriate depending on the mode of use or application applied to the present invention.

What is claimed is:

1. A semiconductor device comprising:

a substrate;

a circuit region provided in the substrate;

a first power supply line and a second power supply line, positioned in the circuit region;

a first fin and a second fin, each fin extending in a first direction in the circuit region, in plan view, and protruding from the substrate;

a first power supply switching circuit, positioned in the circuit region and including a first transistor formed with the first fin, the first power supply switching circuit electrically connecting the first power supply line and the second power supply line, and the first fin extending in the first power supply switching circuit without cutting; and a second power supply switching circuit, positioned in the circuit region and including a second transistor formed with the second fin, the second power supply switching circuit electrically connecting the first power supply line and the second power supply line, and including a fin-cut part in which the second fin is cut.

2. The semiconductor device according to claim 1, further comprising a plurality of the first power supply switching circuits, wherein the plurality of first power supply switching circuits are positioned next to one end of the circuit region in the first direction, an opposite end of the circuit region in the first direction, or the one end and the opposite end of the circuit region in the first direction.

3. The semiconductor device according to claim 2, wherein the circuit region includes:

a first circuit region whose width in the first direction is less than or equal to a first width; and a second circuit region whose width in the first direction is greater than the first width, wherein the first power supply switching circuits are positioned in the first circuit region, or positioned in both the first circuit region and the second circuit region, and wherein the second power supply switching circuit is positioned in the second circuit region.

4. The semiconductor device according to claim 3, wherein a plurality of the first fins and a plurality of the second fins are positioned side by side in a second direction intersecting the first direction in plan view, wherein the plurality of first power supply switching circuits provided in the first circuit region are positioned, respectively, at the one end and at the opposite end of the first circuit region in the first direction, wherein at least one of the plurality of first power supply switching circuits that is positioned at the one end of the first circuit region is connected to one of the plurality of first fins positioned in the first circuit region, and wherein at least one of the plurality of first power supply switching circuits that is positioned at the opposite end of the first circuit region is connected to one of the plurality of first fins that is not connected with the first power supply switching circuit positioned at the one end of the first circuit region.

5. The semiconductor device according to claim 4, wherein the plurality of first power supply switching circuits, provided in the first circuit region, are positioned at the one end and at the opposite end of the first circuit region in the first direction, alternately, following the second direction.

6. The semiconductor device according to claim 1, wherein the first power supply switching circuit and the second power supply switching circuit each include:

a first well tap that is electrically connected to a first well region of a first type of conductivity formed in the substrate, and configured to feed a first voltage to the first well region; and a second well tap that is electrically connected to a second well region of a second type of conductivity formed in the substrate, and configured to feed a second voltage to the second well region.

7. The semiconductor device according to claim 6, wherein the first power supply switching circuit and the second power supply switching circuit each include one first well tap and a pair of second well taps positioned on both sides of the one first well tap.

8. The semiconductor device according to claim 1, wherein the first transistor includes a first weak transistor and a first strong transistor having larger drive capability than the first weak transistor, and wherein the second transistor includes a second weak transistor and a second strong transistor having larger drive capability than the second weak transistor.

* * * * *